United States Patent [19]

Gainey

[11] Patent Number: 5,550,323

[45] Date of Patent: Aug. 27, 1996

[54] MOUNTING OF ELECTRONIC DEVICES

[75] Inventor: Trevor C. Gainey, Kent, England

[73] Assignee: LSI Logic Corporation, Milpitas, Calif.

[21] Appl. No.: 142,820

[22] Filed: Oct. 26, 1993

Related U.S. Application Data

[63] Continuation of Ser. No. 856,904, filed as PCT/GB91/01461 Aug. 28, 1991, abandoned.

[51] Int. Cl.$^6$ ........................................................ H02G 3/08
[52] U.S. Cl. ........................................... 174/52.1; 257/692
[58] Field of Search ................................... 174/52.1, 52.4; 206/328, 330, 820; 257/690, 692, 694, 723, 724, 731, 730; 29/835

[56] References Cited

U.S. PATENT DOCUMENTS

| | | | |
|---|---|---|---|
| 4,721,993 | 1/1988 | Walter | 357/70 |
| 4,801,561 | 1/1989 | Sankhagowit | 174/52.2 X |
| 4,849,857 | 7/1989 | Butt et al. | 361/388 |
| 4,855,807 | 8/1989 | Yamaji et al. | 174/52.4 X |
| 4,874,722 | 10/1989 | Bednarz et al. | 174/52.1 X |
| 4,914,741 | 4/1990 | Brown et al. | 357/74 |
| 4,948,645 | 8/1990 | Holzinger et al. | 428/40 |
| 5,028,983 | 7/1991 | Bickford et al. | 357/69 |
| 5,064,706 | 11/1991 | Ueda et al. | 174/52.4 |
| 5,138,438 | 8/1992 | Masayuki et al. | 174/52.4 X |
| 5,152,057 | 10/1992 | Murphy | 174/52.4 X |
| 5,155,299 | 10/1992 | Mahulikar et al. | 174/52.4 |

*Primary Examiner*—Morris H. Nimmo
*Assistant Examiner*—Christopher Horgan
*Attorney, Agent, or Firm*—Townsend and Townsend and Crew

[57] ABSTRACT

In contrast to the conventional automated bonding system, an electronic device (10) is mounted within a surrounding ring frame (12, 14) of insulating material by means of a plurality of individually applied tapes or ribbons (16) of electrically conductive material. A protective coating (18) may be applied to the assembly after bonding.

18 Claims, 1 Drawing Sheet

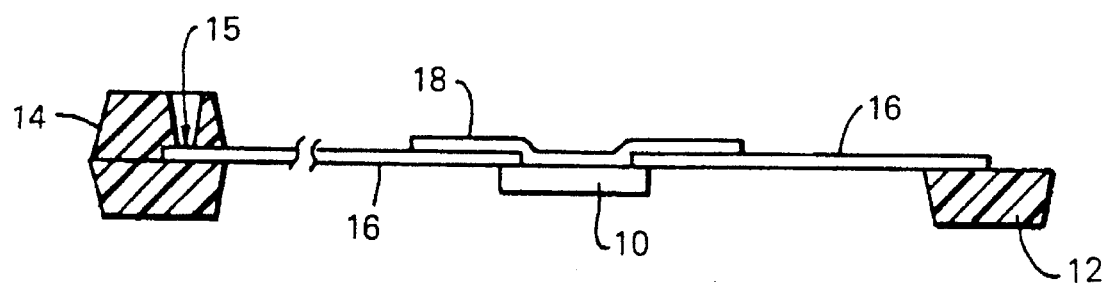

MOUNTING OF ELECTRONIC DEVICES

This is a continuation of commonly-owned, U.S. patent application Ser. No. 07/856,904, filed as a national phase PCT application, based on international application no. PCT/GB91/01461, filed Aug. 28, 1991 now abandoned.

BACKGROUND OF THE INVENTION

This invention relates to methods of and means by which an electronic device may be provided with leads directly bonded to the active surface of the electronic device and provided to a user in a format suitable for the device to be mounted on a subsequent assembly.

The conventional Tape Automated Bonding (TAB) method of attaching electronic devices to a leadframe involves the use of a preformed and therefore fixed design of leadframe.

SUMMARY OF THE INVENTION

In accordance with the present invention, in contrast to the conventional TAB method, the interconnection between the electronic device and an outer insulating member is provided by lengths of electrically conductive material extending between the device and the insulating member.

Preferably, the interconnection is provided by means of tapes or ribbons of conductive material applied individually between the electronic device and an outer, insulating ring of material.

BRIEF DESCRIPTION OF THE DRAWINGS

The FIGURE is an illustrative embodiment of the invention.

DETAILED DESCRIPTION OF PREFERRED EMBODIMENTS

In order that the invention may be more fully understood, one presently preferred embodiment will now be described by way of example and with reference to the accompanying drawing which is a schematic cross-sectional view through the assembly.

In the drawing, an electronic device is indicated at 10. This may be any electronic device, such as for example a semiconductor device or a circuit based thereon. Around the device 10, as part of the assembly, extends a ring of electrically insulating material. This may be in the form of a one-part ring 12 as shown at the right-hand half of the drawing or a two-part ring 14 as shown at the left-hand half of the drawing. The ring 14 is shown as being provided with a test point 15, i.e. a hole through the ring by means of which one can gain access to the centre thereof. Between the device 10 and the insulating ring 12 or 14 extend a plurality of tapes or ribbons 16 of electrically conductive material. These tapes or ribbons 16 are applied individually between the device 10 and the outer ring.

The bonding of the tapes 16 may be achieved by the use of ultrasonic energy to ensure bonding to bond pads on the device 10 and on the outer insulating ring 12, 14. The, outer ring 12, 14 may either be provided with metallization on which to form the outer bond or may be left unmetallized. After bonding, the device 10 and tapes 16 may be coated with a flexible, electrically insulating material 18 to provide physical and environmental protection for the device 10 and for the inner parts of the tapes 16. This protective layer or coating 18 may be provided by the application of a preformed film of material, or may be applied as a liquid or spray.

The outer parts of the tapes or ribbons 16 may be contacted directly, in order to perform electrical testing and burn-in of the device. Alternatively, the outer ring 12, 14 may have metallization on a fixed pattern to enable these functions to be performed.

With an assembly of this nature in accordance with the invention a plurality of different devices 10 may be accommodated within a single design of ringframe 12, 14 by the use of an appropriate array of tapes or ribbons. During the mounting operation the tapes are cut and bonded to mounting pads on the circuit board assembly in the usual way.

In a modification of the assembly according to the invention, the tapes or ribbons 16 may be connected between the device 10 and a conventional TAB outer leadframe. With this arrangement the device 10 is excised and mounted in the normal way by cutting the TAB leadframe. This has the added advantage of standardising not only the test hardware but also the design of mounting pads on which the device 10 will be mounted.

I claim:

1. An electronic device assembly comprising:

at least one electronic device, a single electrically insulating support structure, in the form of a ring, disposed circumferentially around the at least one electronic device, and a plurality of individual, discrete lengths of electrically conductive material extending between the at least one electronic device and the support structure, wherein the individual, discrete lengths of electrically conductive material are in the form of tapes or ribbons, the at least one electronic device is disposed in a central area defined within the ring of the support structure, each individual, discrete length of electrically conductive material having a one end and an other end, the one end of each length of electrically conductive material directly bonded to the at least one electronic device and the other end of each length of electrically conductive material bonded to the support structure.

2. An electronic device assembly as claimed in claim 1, wherein:

the at least one electronic device and at least an inner portion of the individual, discrete lengths of electrically conductive material are coated by an electrically insulating material.

3. An electronic device assembly as claimed in claim 1, wherein:

the other ends of the individual, discrete lengths of electrically conductive material are bonded to the support structure by ultrasonic bonding.

4. An electronic device assembly as claimed in claim 1, having:

a plurality of electronic devices disposed within the central area of the support structure;

portions of the plurality of individual, discrete lengths of electrically conductive material extending between each of the plurality of electronic devices and the support structure.

5. An electronic device assembly as claimed in claim 2, wherein:

the other ends of the individual, discrete lengths of electrically conductive material are bonded to the support structure by ultrasonic bonding.

6. An electronic device assembly as claimed in claim 2, having:

a plurality of electronic devices disposed within the central area of the support structure;

portions of the plurality of individual, discrete lengths of electrically conductive material extending between each of the plurality of electronic devices and the support structure.

7. An electronic device assembly as claimed in claim 3, having:

a plurality of electronic devices disposed within the central void area of the support structure;

portions of the plurality of individual, discrete lengths of electrically conductive material extending between each of the plurality of electronic devices and the support structure.

8. An electronic device assembly according to claim 1, wherein:

the electronic device is in a plane;

the support structure is a two-part ring having an upper part above the plane and a lower part below the plane;

the individual, discrete lengths of electrically conductive material are in the plane, and are disposed between opposing surfaces of the upper and lower parts of the support means.

9. An electronic device assembly, according to claim 8, further comprising:

a plurality of holes extending through the upper part of the support means, each hole aligned with a corresponding conductor in the individual, discrete lengths of electrically conductive material;

wherein the holes provide electrical access to test the at least one electronic device.

10. An electronic device assembly, according to claim 1, further comprising:

a pattern of metallization on the support structure corresponding to points whereat the individual, discrete lengths of electrically conductive material are bonded to the support structure.

11. A method of providing connections to an electronic device, comprising:

providing a ring structure, the ring structure establishing a plane;

disposing a die within the ring structure, in the plane of the ring structure;

individually applying a plurality of discrete conductive lengths extending between the ring structure and the die, and bonding inner ends of the lengths directly to the die, wherein the discrete conductive lengths are in the form of tapes or ribbons;

removing the ring structure by cutting the Lengths at an intermediate position within the interior of the ring, between the ring and the die, so that a portion of the lengths extends outward from the die; and connecting outer ends of the portions of the lengths to an electronic system.

12. Method, according to claim 11, further comprising:

testing or exercising the die prior to removing the ring structure.

13. Method according to claim 11, wherein:

the support ring is a two-part ring, having an upper part and a lower part;

outer ends of the lengths are sandwiched between the upper and lower parts of the support ring.

14. Method, according to claim 13, further comprising:

providing holes through the upper part of the support ring, said holes being aligned with corresponding conductors in the plurality of discrete conductive lengths sandwiched between the upper and lower parts of the support ring;

wherein the holes provide electrical access to test the die.

15. Method, according to claim 13, further comprising:

prior to removing the ring structure, ultrasonically bonding the outer ends of the lengths between the upper and lower parts of the support ring.

16. Method, according to claim 11, further comprising:

disposing two or more electronic devices within the ring structure, in the plane of the ring structure, wherein one of the two or more electronic devices is the die.

17. Method, according to claim 11, further comprising:

coating inner portions of the lengths with an electrically insulating material.

18. Method, according to claim 11, further comprising:

coating the die with an electrically insulating material.

* * * * *